United States Patent
Wang et al.

(10) Patent No.: US 7,512,914 B2
(45) Date of Patent: Mar. 31, 2009

(54) METHOD OF IMPROVING ELECTRONIC COMPONENT TESTABILITY RATE

(75) Inventors: Hung-Sheng Wang, Taipei (TW); Chi-Yen Ho, Taipei (TW); Din-Guow Ma, Taipei (TW); Chi-Kuen Yu, Taipei (TW); Hui-Kuo Tsao, Taipei (TW)

(73) Assignee: Inventec Corporation, Taipei (TW)

( * ) Notice: Subject to any disclaimer, the term of this patent is extended or adjusted under 35 U.S.C. 154(b) by 293 days.

(21) Appl. No.: 11/420,727

(22) Filed: May 26, 2006

(65) Prior Publication Data

US 2007/0277132 A1  Nov. 29, 2007

(51) Int. Cl.
 *G06F 17/50* (2006.01)
(52) U.S. Cl. ............................................. 716/4; 716/15
(58) Field of Classification Search ...................... 716/4, 716/15
 See application file for complete search history.

(56) References Cited

U.S. PATENT DOCUMENTS

| | | | | |
|---|---|---|---|---|
| 4,194,113 A | * | 3/1980 | Fulks et al. ................... | 714/32 |
| 4,711,024 A | * | 12/1987 | Russell ........................ | 29/832 |
| 5,710,934 A | * | 1/1998 | Bona et al. .................. | 714/724 |
| 6,675,362 B1 | * | 1/2004 | Ortiz et al. ..................... | 716/4 |
| 6,882,950 B1 | * | 4/2005 | Jennion et al. .............. | 702/118 |
| 7,089,139 B2 | * | 8/2006 | Loh et al. .................... | 702/117 |

* cited by examiner

*Primary Examiner*—Jack Chiang
*Assistant Examiner*—Brandon W Bowers
(74) *Attorney, Agent, or Firm*—Apex Juris, pllc; Tracy M. Heims

(57) ABSTRACT

A method of improving the electronic component testability rate is provided. The method includes the steps of: designing a circuit, providing electronic component data of the circuit, extracting the test data of electronic components, providing a circuit board and making a test position table, providing an electronic component test fixture and a test program, determining whether the test program is appropriate, debugging the test program, and obtaining a test report. This increases the electronic component testability rate. At the same time, it improves the conventional test method that only provides information of where test points are still needed but no further detail.

6 Claims, 2 Drawing Sheets

METHOD OF IMPROVING ELECTRONIC COMPONENT TESTABILITY RATE

BACKGROUND OF THE INVENTION

1. Field of Invention

The invention relates to a method of improving the testability rate of electronic component and, in particular, to a method of increasing the IC testability rate by providing the position information of test points.

2. Related Art

Currently, most of the circuit board manufacturers decide test points before finishing the blueprint, which is then transferred to continue subsequent tasks. However, in the flowchart of current circuit board designs, the design engineers determine the test points based upon the ICT test pad list and the testability report of the design for manufacturability (DFM), but there is no priority in the test points. The considerations are purely based upon the circuit board area, the layout factors, and the blueprint arrangement, with as many test pads as possible.

In accord with the current procedure, even though the testability rate can be increased as high as possible, the allocation of the test pads may be inconsistent with the test requirements in the end. Therefore, the testability rate will not increase in proportion. In view of the limited circuit board area, the value of the position of each test point should be increased too. This is something that the current procedure cannot achieve.

Since the conventional electronic component test method cannot increase its testability rate, how to design a new electronic component test method with a higher testability rate is an important object of the manufacturers.

SUMMARY OF THE INVENTION

In view of the foregoing, the invention provides a method of improving the electronic component testability rate. This method simultaneously solves the problem that the conventional electronic component test method only provides the information of where test points are still needed but no further detail.

To achieve the above object, the disclosed method includes the steps of: design a circuit, provide data of electronic components of the circuit, extract the test data of the electronic components, provide a circuit board and make a test position table, provide an electronic component test fixture and a test program, determine whether the test program is appropriate, debug the test program, and obtain a test report.

The implementation of the invention can achieve the following effects:

1. The disclosed method of improving the electronic component testability rate can provide required information for testing from a test database at the early stage of the circuit design, for the reference of the design engineers in the layout. The positions of the test points can thus be determined at the early stage with more information. Even if the design is changed, careless modification of the test points can be avoided or it is possible to know the testability rate loss due to the change. Therefore, it is easier to amend and effectively provide test requirements.

2. The invention continuously store and accumulate test knowledge and experiences by establishing a test database. This helps providing more complete information and improving test program quality.

3. In accord with the disclosed method, the test database stores all the test knowledge and experiences. The test database is used at the early stage of the circuit design for providing electronic component data and test requirements. Before the blueprint is laid out, the design engineers have sufficient information to make modification or add test points.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

Figure 2:
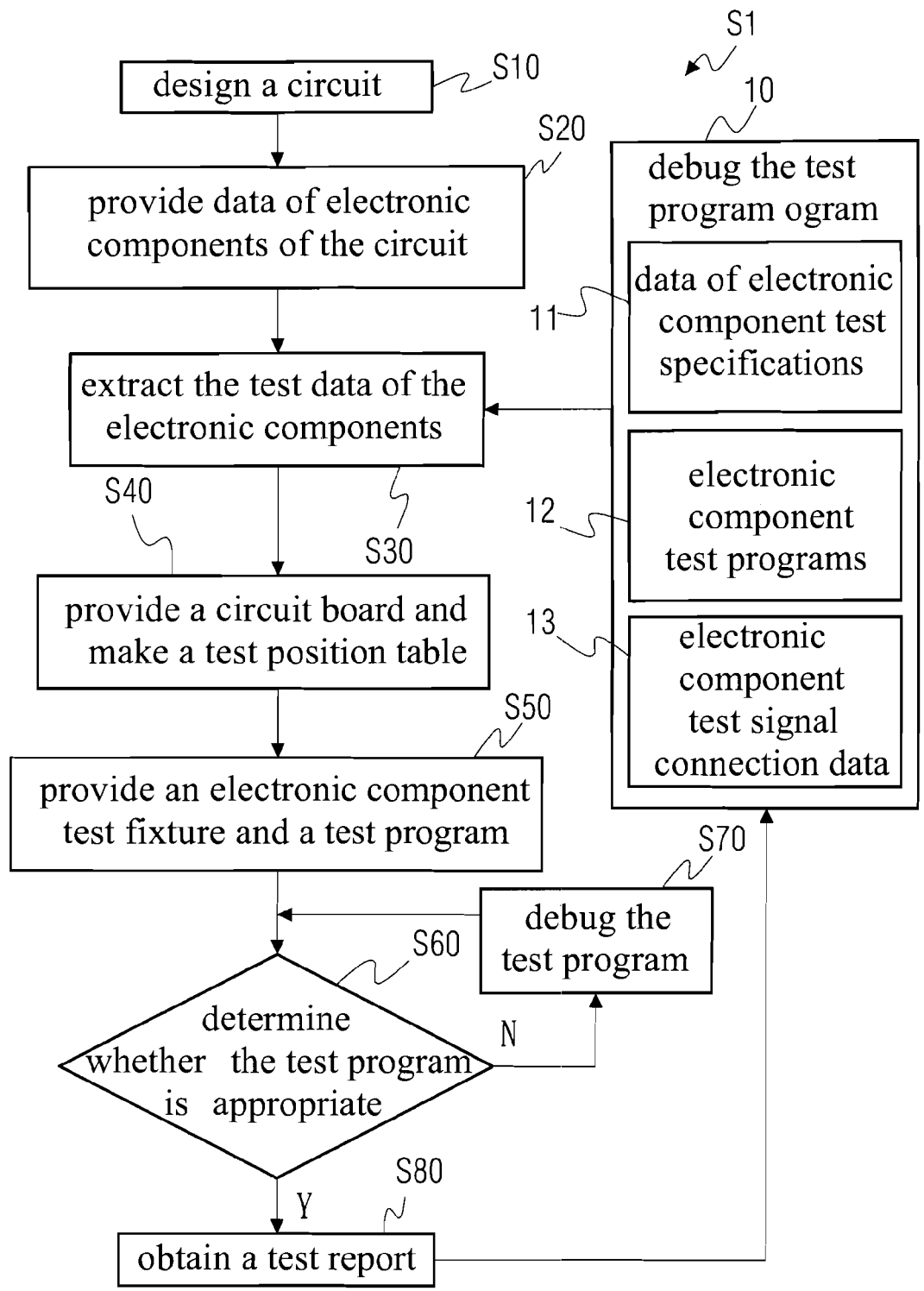
FIG. 2 is a flowchart of the disclosed method of improving the electronic component testability rate.

With reference to FIG. 2, the invention pertains to a method of improving the electronic component testability rate SI. It includes the steps of: design a circuit (S10), provide data of electronic components of the circuit (S20), extract the test data of the electronic components (S30), provide a circuit board and make a test position table (S40), provide an electronic component test fixture and a test program (S50), determine whether the test program is appropriate (S60), debug the test program (S70) and obtain a test report (S80).

Figure 1:
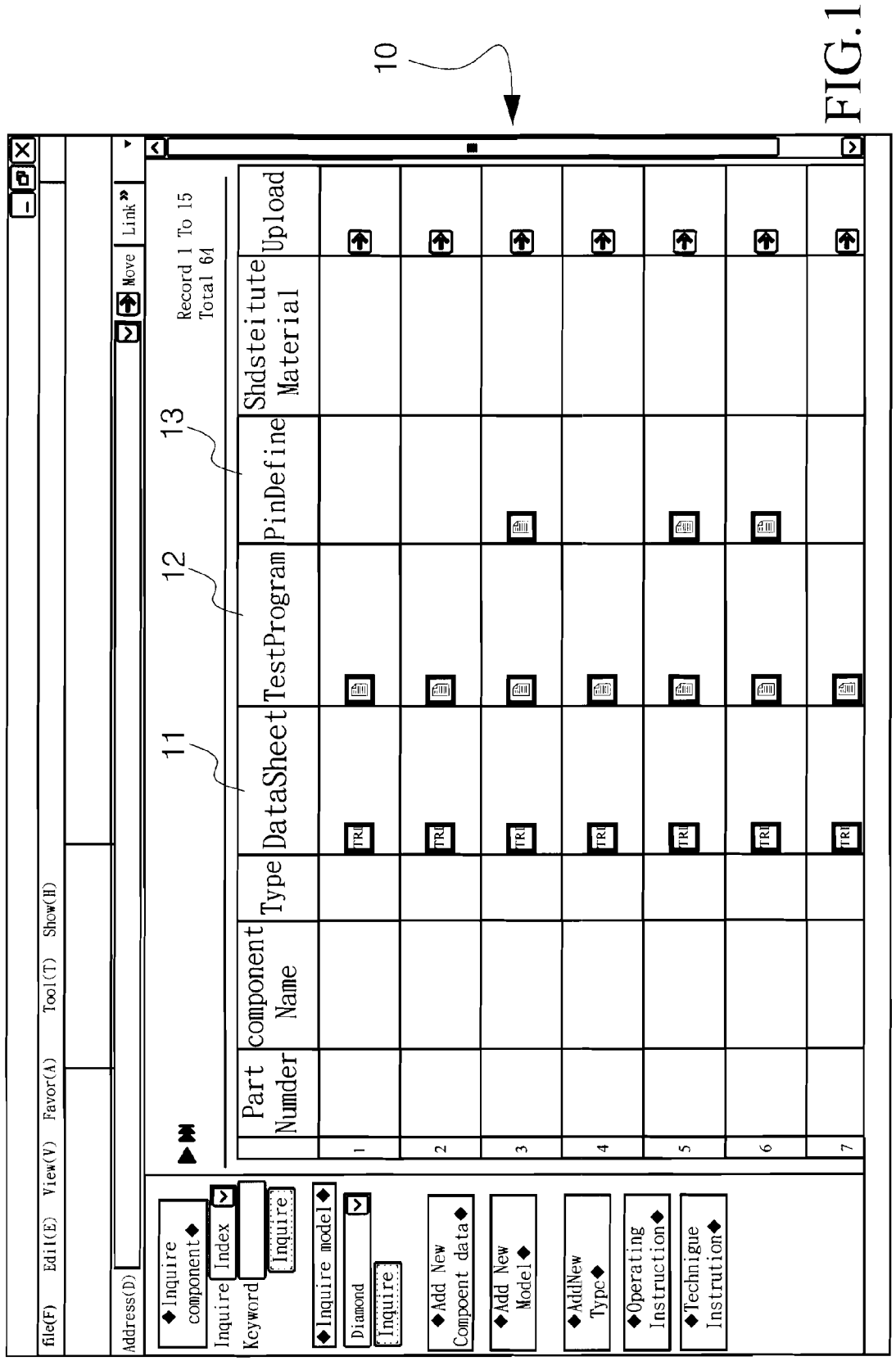
FIG. 1 is a schematic view of the test database in the invention.

With reference to FIGS. 1 and 2, the disclosed method S1 first performs a circuit design process (step S10). Data of the electronic components required in the circuit design are provided (step S20). The test data of electronic components are extracted (step S30). The electronic component test data are stored in a test database 10. The test database 10 stores the data of electronic component test specifications 11, the electronic component test programs 12, and the electronic component test signal connection data 13. A circuit board and a test position table are provided (step S40). The circuit board is configured with a plurality of electronic components and their test points in accord with the above-mentioned circuit design. A test position table of these electronic component test points is made for the subsequent test fixture. Afterwards, an electronic component test fixture and a test program are provided (step S50). The test position table is employed to make the electronic component test fixture and to select the test points of the test program for testing the circuit board. Finally, whether the test program is appropriate is evaluated (step S60). If the test program is inappropriate, then a debugging process is performed (step S70), followed by further evaluation of whether the test program is appropriate. When the test program is determined to be inappropriate, the procedure determines whether the test program has been updated or cannot be performed for testing. If the test program is appropriate, a test report is obtained (step S80). The test report can achieve a high testability rate.

In accord with the disclosed method of improving the electronic component testability rate, the results obtained in the step of obtaining a test report (step S80) are stored in the test database 10. Moreover, the test database 10 is a correlation database. The circuit board may be a flexible circuit board or a rigid circuit board.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of improving an electronic component testability rate, comprising the steps of:

designing a circuit;

providing data of electronic components of the circuit;

extracting the test data of electronic components from a test database, the test database storing the data of electronic component test specifications, test programs, and test signal connection data;

providing a circuit board and making a test position table, wherein the circuit board is disposed with a plurality of electronic components and a plurality of test points in accord with the circuit design and the test position table is made in accord with the electronic component test points;

providing an electronic component test fixture and a test program, wherein the test position table is employed to make the electronic component test fixture and to select test points of the test program for testing the circuit board;

determining whether the test program is appropriate and, if it is inappropriate, performing a debugging process and re-determining whether the test program is appropriate; and obtaining a test report when the test program is appropriate.

2. The method of claim 1, wherein the result of the test report is stored in the test database.

3. The method of claim 1 further comprising the step of checking whether the test program has been updated or is unable to perform testing when the test program is inappropriate.

4. The method of claim 1, wherein the test database is a correlation database.

5. The method of claim 1, wherein the circuit board is a flexible circuit board.

6. The method of claim 1, wherein the circuit board is a rigid circuit board.

* * * * *